(12) United States Patent
Nagao

(10) Patent No.: US 11,594,861 B2
(45) Date of Patent: *Feb. 28, 2023

(54) SEMICONDUCTOR LASER ELEMENT

(71) Applicant: NICHIA CORPORATION, Anan (JP)

(72) Inventor: Yoji Nagao, Tokushima (JP)

(73) Assignee: NICHIA CORPORATION, Anan (JP)

( * ) Notice: Subject to any disclaimer, the term of this patent is extended or adjusted under 35 U.S.C. 154(b) by 36 days.

This patent is subject to a terminal disclaimer.

(21) Appl. No.: 17/131,331

(22) Filed: Dec. 22, 2020

(65) Prior Publication Data

US 2021/0111540 A1 Apr. 15, 2021

Related U.S. Application Data

(63) Continuation of application No. 16/554,484, filed on Aug. 28, 2019, now Pat. No. 10,903,624.

(30) Foreign Application Priority Data

Aug. 31, 2018 (JP) .............................. JP2018-162260

(51) Int. Cl.
*H01S 5/343* (2006.01)
*H01S 5/026* (2006.01)

(52) U.S. Cl.
CPC .......... *H01S 5/34333* (2013.01); *H01S 5/026* (2013.01); *H01S 5/34346* (2013.01)

(58) Field of Classification Search
USPC ........................................................ 372/50.1
See application file for complete search history.

(56) References Cited

U.S. PATENT DOCUMENTS 6,031,858 A * 2/2000 Hatakoshi ........... H01S 5/32341
372/45.01
6,711,191 B1 3/2004 Kozaki et al.
(Continued)

FOREIGN PATENT DOCUMENTS

JP 2001-057460 A 2/2001
JP 2001-057461 A 2/2001
(Continued)

OTHER PUBLICATIONS

Notice of Allowance on U.S. Appl. No. 16/554,484 dated Sep. 25, 2020.

*Primary Examiner* — Tuan N Nguyen
(74) *Attorney, Agent, or Firm* — Foley & Lardner LLP

(57) ABSTRACT

A semiconductor laser element includes: a first nitride semiconductor layer of a first conductivity-type; a second nitride semiconductor layer of a second conductivity-type; and an active region disposed between the first nitride semiconductor layer and the second nitride semiconductor layer, the active region having a single quantum well structure. The active region comprises a first barrier layer, an intermediate layer, a well layer, and a second barrier layer, in this order in a direction from the first nitride semiconductor layer toward the second nitride semiconductor layer. The well layer is composed of InGaN. The second barrier layer is undoped. A lattice constant of the intermediate layer is greater than a lattice constant of each of the first barrier layer and the second barrier layer, and smaller than a lattice constant of the well layer. A thickness of the intermediate layer is greater than a thickness of the well layer.

13 Claims, 6 Drawing Sheets

(56) References Cited

U.S. PATENT DOCUMENTS

| | | |
|---|---|---|
| 8,030,641 B2 | 10/2011 | Tansu et al. |
| 10,903,624 B2 * | 1/2021 | Nagao ................ H01S 5/34346 |
| 2002/0053676 A1 | 5/2002 | Kozaki |
| 2003/0205736 A1 | 11/2003 | Kozaki |
| 2004/0101986 A1 | 5/2004 | Kozaki et al. |
| 2005/0098789 A1 | 5/2005 | Kozaki |
| 2005/0199903 A1 | 9/2005 | Kyono et al. |
| 2006/0078022 A1 | 4/2006 | Kozaki et al. |
| 2006/0131604 A1 | 6/2006 | Kozaki |
| 2007/0223546 A1 | 9/2007 | Brenner et al. |
| 2008/0029758 A1 | 2/2008 | Kozaki |
| 2010/0150194 A1 | 6/2010 | Tsuchiya et al. |
| 2010/0252811 A1 | 10/2010 | Kozaki |
| 2012/0138889 A1 | 6/2012 | Tachibana et al. |
| 2012/0138890 A1 | 6/2012 | Shioda et al. |
| 2013/0028281 A1 | 1/2013 | Avramescu et al. |
| 2013/0056707 A1 | 3/2013 | Kozaki |
| 2014/0153602 A1 | 6/2014 | Tachibana et al. |
| 2014/0203242 A1 | 7/2014 | Kozaki |
| 2015/0063395 A1 | 3/2015 | Avramescu et al. |
| 2015/0270445 A1 | 9/2015 | Tachibana et al. |
| 2015/0364649 A1 | 12/2015 | Kozaki |
| 2016/0352077 A1 * | 12/2016 | Kasahara .............. H01S 5/3407 |

FOREIGN PATENT DOCUMENTS

| | | |
|---|---|---|
| JP | 2001-168471 A | 6/2001 |
| JP | 2002-223042 A | 8/2002 |
| JP | 2004-022989 A | 1/2004 |
| JP | 2004-031770 A | 1/2004 |
| JP | 2004-087908 A | 3/2004 |
| JP | 2004-356256 A | 12/2004 |
| JP | 2005-268743 A | 9/2005 |
| JP | 2010-141242 A | 6/2010 |
| JP | 2011-151275 A | 8/2011 |
| JP | 2012-119515 A | 6/2012 |
| JP | 2012-119560 A | 6/2012 |
| WO | WO-201 0/112310 A1 | 10/2010 |

\* cited by examiner

SEMICONDUCTOR LASER ELEMENT

CROSS-REFERENCE TO RELATED APPLICATIONS

The present application is a continuation of U.S. patent application Ser. No. 16/554,484, filed on Aug. 28, 2019, which claims priority to Japanese Patent Application No. 2018-162260, filed on Aug. 31, 2018, the disclosures of which are hereby incorporated by reference in their entireties.

BACKGROUND

The present disclosure relates to a semiconductor laser element.

Japanese Patent Publication No. 2004-356256 and Japanese Patent Publication No. 2011-151275 disclose a nitride semiconductor light emitting element including an active region including a well layer, a barrier layer, and an intermediate layer disposed between the well layer and the barrier layer. The nitride semiconductor light emitting element is, for example, a semiconductor laser element.

SUMMARY

It is desired to further reduce a threshold current at which laser oscillation occurs in a semiconductor laser element.

According to one embodiment, a semiconductor laser element includes a first nitride semiconductor layer that is a first conductivity-type layer; a second nitride semiconductor layer that is a second conductivity-type layer; and an active region disposed between the first nitride semiconductor layer and the second nitride semiconductor layer, the active region having a single quantum well structure. The active region includes a first barrier layer, an intermediate layer, a well layer and a second barrier layer in this order from the first nitride semiconductor layer side. The intermediate layer has a lattice constant greater than a lattice constant of each of the first barrier layer and the second barrier layer, and smaller than a lattice constant of the well layer. The intermediate layer has a thickness greater than a thickness of the well layer. The well layer and the second barrier layer are in contact with each other, or a distance between the well layer and the second barrier layer is smaller than a distance between the first barrier layer and the well layer.

According to another embodiment, a semiconductor laser element includes a first nitride semiconductor layer that is a first conductivity-type layer; a second nitride semiconductor layer that is a second conductivity-type layer; and an active region disposed between the first nitride semiconductor layer and the second nitride semiconductor layer, the active region having a multiple quantum well structure. The active region includes a first barrier layer, a first intermediate layer, a first well layer, an intermediate barrier layer, a second intermediate layer, a second well layer and a second barrier layer in this order from a side of the first nitride semiconductor layer. The first intermediate layer has a lattice constant greater than a lattice constant of each of the first barrier layer and the intermediate barrier layer, and smaller than a lattice constant of the first well layer. The second intermediate layer has a lattice constant greater than a lattice constant of each of the intermediate barrier layer and the second barrier layer, and smaller than a lattice constant of the second well layer. The first intermediate layer has a thickness greater than a thickness of the first well layer. The second intermediate layer has a thickness greater than a thickness of the second well layer. The first well layer and the intermediate barrier layer are in contact with each other, or a distance between the first well layer and the intermediate barrier layer is smaller than a distance between the first barrier layer and the first well layer. The second well layer and the second barrier layer are in contact with each other, or a distance between the second well layer and the second barrier layer is smaller than a distance between the intermediate barrier layer and the second well layer.

Because the semiconductor laser element has such a configuration, a threshold current of the semiconductor laser element may be reduced.

DETAILED DESCRIPTION OF EMBODIMENTS

Figure 1:
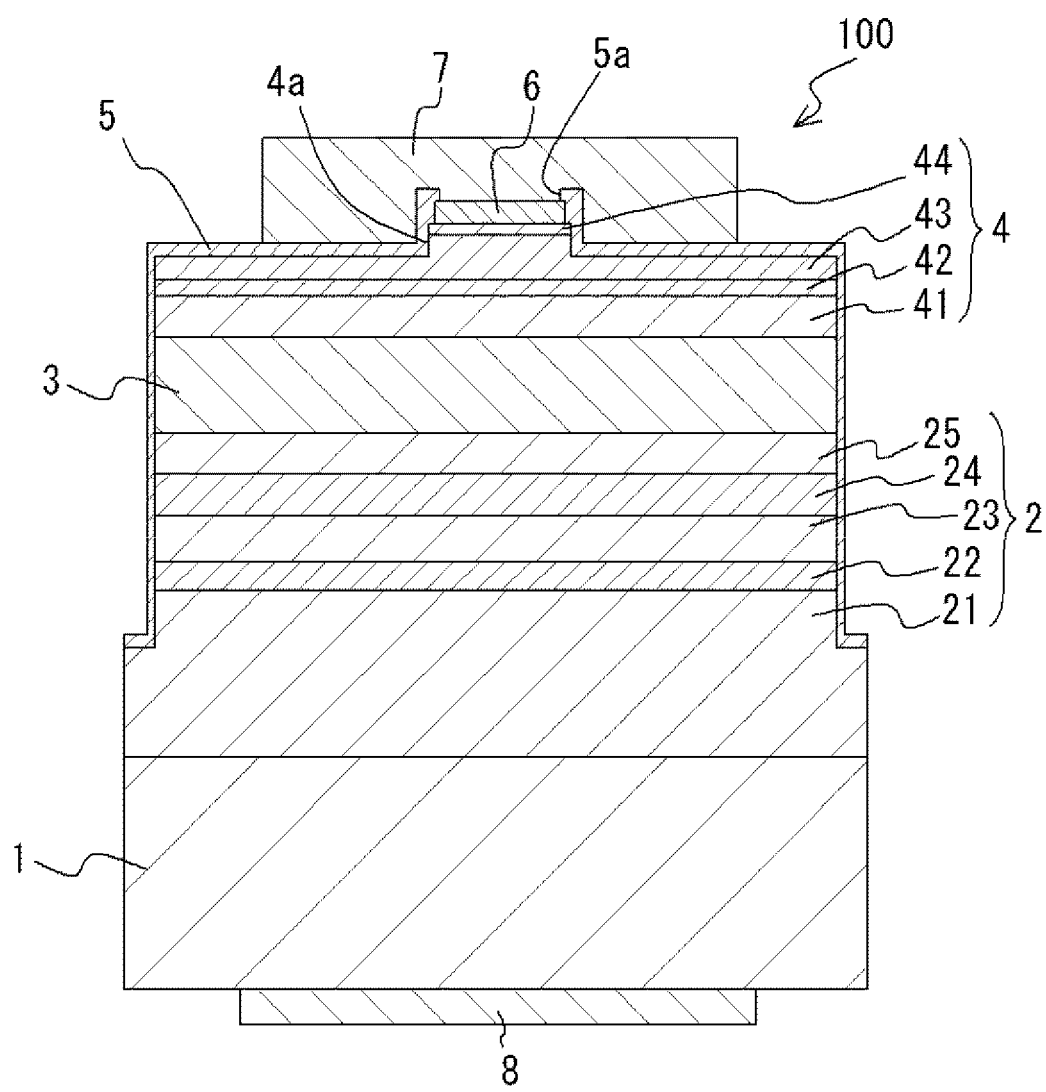
FIG. 1 is schematic sectional view illustrating a semiconductor laser element according to certain embodiment of the present disclosure.

Hereinafter, embodiments of the present disclosure will be described with reference to the drawings. It is to be noted that the embodiment described below is intended to illustrate a method for implementing the technical ideas of the present disclosure, and the present invention is not limited to the following embodiment. Further, in the following description, the same designations and reference numerals show the same members or those of similar characteristics, for which the detailed explanation will be omitted as appropriate.

Semiconductor Laser Element 100

FIG. 1 is schematic sectional view illustrating a semiconductor laser element 100 according to one embodiment of the present disclosure, and shows a cross-section in a direction perpendicular to an extending direction of a resonator of the semiconductor laser element 100. The semiconductor laser element 100 includes a first nitride semiconductor layer that is a first conductivity-type (i.e., third n-type semiconductor layer 23), a second nitride semiconductor layer that is a second conductivity-type (i.e., second p-type semiconductor layer 43), and an active region 3 disposed between the first nitride semiconductor layer and the second nitride semiconductor layer. More specifically, in the semiconductor laser element 100, an n-side region 2 having an n-type nitride semiconductor layer, the active region 3, and a p-side region 4 having a p-type nitride semiconductor layer are provided on a substrate 1 in this order. A surface of the p-side region 4 is provided with a ridge 4a. A portion of the active region 3 immediately under the ridge 4a and the vicinity thereof serves as a waveguide region. An insulating film 5 is provided on the upper surface of the ridge 4a and the surface of the p-side region 4 which is continued from the lateral surface of the ridge 4a. The substrate 1 is the n-type substrate, and has an n-electrode 8 provided on the lower surface thereof. In addition, a p-electrode 6 is provided in contact with the ridge 4a on the surface of the p-side region 4, and a p-side pad electrode 7 is provided on the p-electrode 6.

Substrate 1

For the substrate 1, a nitride semiconductor substrate containing, for example, GaN or AlN as a main component can be used. A substrate other than a nitride semiconductor substrate may be used. Examples of the substrate include insulating substrates such as sapphire or the like, semiconductor substrates such as SiC, Si, ZnO, $Ga_2O_3$, GaAs or the like, and template substrates including a nitride semiconductor grown on glass or the like. A piezoelectric field as described later is particularly easily generated in the case in which a semiconductor layer to be grown on the substrate 1 used as a growth substrate is grown along +c-axis direction. Therefore, in the case in which the substrate 1 is a growth substrate, it is preferable that a GaN substrate with +c-plane as a principal surface, a sapphire substrate with c-plane as a principal surface, or the like is used for the substrate 1 so that a nitride semiconductor is grown along +c-axis. In the present embodiment, the term "with +c-plane or c-plane as a principal surface" does not necessarily mean a plane that is exactly +c-plane or c-plane, but may include a plane having an angular offset of 1 degree or less. Further, a GaN substrate is preferably used rather than a sapphire substrate because a dislocation density of a nitride semiconductor layer grown on the substrate can be reduced, and thus an intermediate layer 32 as described later may be easily provided with a greater thickness.

N-Side Region 2

The n-side region 2 may be a nitride semiconductor layer configured as a single-layer or multilayer structure. Examples of the n-type semiconductor layer positioned in the n-side region 2 may include nitride semiconductor layers containing an n-type impurity such as Si or Ge. In the n-side region 2, for example, a first n-type semiconductor layer 21, a second n-type semiconductor layer 22, the third n-type semiconductor layer 23 (i.e., n-type nitride semiconductor layer) and a fourth n-type semiconductor layer 24 are provided in this order from the substrate 1 side. In the n-side region 2, layers other than these layers may be included, and some of these layers may be omitted.

The first to fourth n-type semiconductor layers 21 to 24 contain an n-type impurity. The first n-type semiconductor layer 21 is, for example, an AlGaN layer. The second n-type semiconductor layer 22 is, for example, an InGaN layer. The third n-type semiconductor layer (i.e., n-type nitride semiconductor layer) 23 is, for example, an $Al_xGa_{1-x}N$ ($0 \leq x < 1$) layer having band-gap energy greater than that of the first n-type semiconductor layer 21. The third n-type semiconductor layer 23 may have maximum band-gap energy in the n-side region 2. The third n-type semiconductor layer 23 may serve as an n-side cladding layer (i.e., first cladding layer). The thickness of the third n-type semiconductor layer 23 is, for example, in a range of about 0.7 82 m to 1.2 μm. The fourth n-type semiconductor layer 24 is, for example, a GaN layer. For example, the thickness of the fourth n-type semiconductor layer 24 is smaller than the thickness of the third n-type semiconductor layer 23.

An n-side compositionally graded layer 25 is a layer in which a composition is gradually changed, for example, from GaN at the substrate 1 side to InGaN at the active region 3 side. The thickness of the n-side compositionally graded layer 25 may be in a range of 50 nm to 500 nm. Preferably, the n-side compositionally graded layer 25 contains an n-type impurity. Because the compositionally graded layer has a layered structure in which the composition is gradually changed, negative fixed charge is produced at a heterogeneous interface in the layered structure, and band spikes generated accordingly form a barrier to injection of carriers. In the case in which the n-side compositionally graded layer 25 contains an n-type impurity, the band spikes can be moderated.

Preferably, the third n-type semiconductor layer 23, the fourth n-type semiconductor layer 24 and the n-side compositionally graded layer 25 have such a relationship that the lattice constant gradually increases in a direction from the third n-type semiconductor layer 23 toward a well layer 33. In this way, strain on the well layer 33 can be mitigated, and an effect of a piezoelectric field can be reduced. A layer serving as an n-side waveguide layer (i.e., first waveguide layer) is, for example, the fourth n-type semiconductor layer 24 and/or the n-side compositionally graded layer 25. The fourth n-type semiconductor layer 24 may be omitted. In the case in which the barrier layer in the active region 3 described later has a small thickness, the n-side compositionally graded layer 25 also serves as a barrier layer.

Active Region 3

Figure 2:
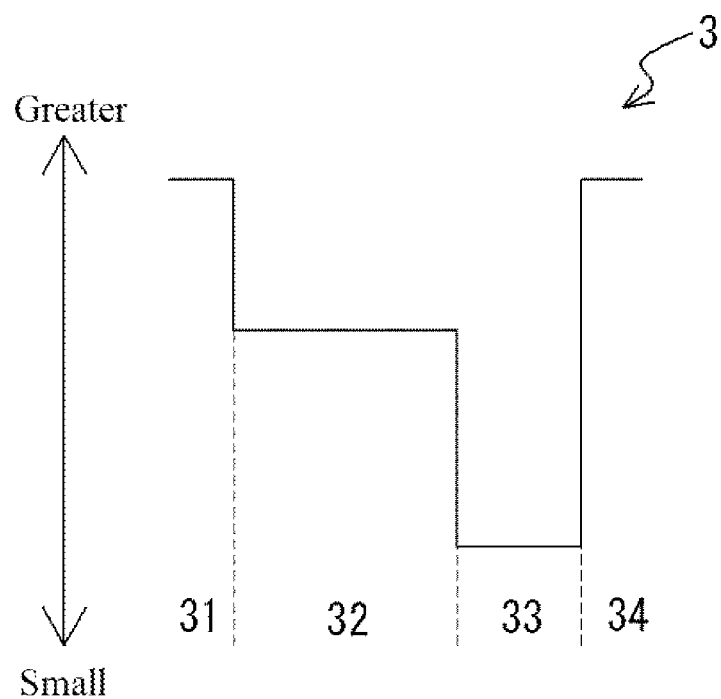
FIG. 2 schematically illustrates band-gap energy of an active region of the semiconductor laser element according to certain embodiment of the present disclosure.

The active region 3 has a single quantum well structure or a multiple quantum well structure. FIG. 2 schematically illustrates band-gap energy of the active region 3 of the semiconductor laser element 100. The active region 3 shown in FIG. 2 has a single quantum well structure. As shown in FIG. 2, the active region 3 may include a first barrier layer 31, the intermediate layer 32, the well layer 33 and a second barrier layer 34 in this order from the first nitride semiconductor layer side. Layers other than these layers may be included in the active region 3, and some of these layers may be omitted. The lattice constant of the intermediate layer 32 is greater than the lattice constant of each of the first barrier layer 31 and the second barrier layer 34, and smaller than the lattice constant of the well layer 33. The thickness of the intermediate later 32 is greater than the thickness of the well layer 33. In FIG. 2, the well layer 33 and the second barrier layer 34 are in contact with each other. Between the well layer 33 and the second barrier layer 34, another layer may be disposed, but in this case, another layer is disposed in such a manner that the distance between the well layer 33 and the second barrier layer 34 is smaller than the distance between the first barrier layer 31 and the well layer 33.

For the well layer 33 in the active region 3, for example, InGaN is used. For the third n-type semiconductor layer 23 and the second p-type semiconductor layer 43 sandwiching the active region 3, for example, AlGaN and GaN are used, respectively. Accordingly, semiconductor layers having different lattice constants are stacked, and therefore, for example, compression strain is applied to the active region 3, particularly to the well layer 33. Application of strain to the well layer 33 causes generation of a piezoelectric field. Generation of the piezoelectric field spatially separates the wave function of holes from the wave function of electrons, so that a carrier recombination probability decreases. In this way, the light emission efficiency of the semiconductor laser element is reduced, leading to raise in threshold current at which the semiconductor laser element performs laser emission.

Thus, in this embodiment, the intermediate layer 32 is provided. By providing the intermediate layer 32 having a lattice constant between that of the first barrier layer 31 and that of the well layer 33, strain applied to the well layer 33 can be mitigated. In addition, by providing the intermediate layer 32, the peak of the wave function of second conductivity-type carriers (e.g. holes) can be made close to the first barrier layer 31 side. Consequently, the carrier recombination probability can be increased. Therefore, the light emission efficiency of the semiconductor laser element 100 can be increased, so that the threshold current can be lowered. In the case in which the intermediate layer 32 is excessively thin, the effect of making the peak of the wave function close to the first barrier layer 31 side is reduced, and therefore the thickness of the intermediate layer 32 is preferably larger than the thickness of the well layer 33. The threshold current density increases as the threshold current increases, and the probability of overflow of carriers from the active region 3 may increase as the threshold current density becomes higher. By reducing the threshold current, the overflow probability can be decreased to improve a temperature characteristic of light output. In this specification, the temperature characteristic of light output refers to a ratio of light output at normal temperature to light output at a high temperature.

It is preferable that the well layer 33 and the second barrier layer 34 are in contact with each other, or alternatively, that the distance between the well layer 33 and the second barrier layer 34 is smaller than the distance between the first barrier layer 31 and the well layer 33. If a layer such as the intermediate layer 32 is provided between the second barrier layer 34 and the well layer 33 as well, the peak of the wave function of first conductivity-type carriers (e.g., electrons) becomes close to the second barrier later 34 side, and the peak of the wave function of second conductivity-type carriers (e.g., holes) becomes close to the first barrier layer 31 side. In this way, spatial overlaps between the wave functions are reduced, leading to reduction of light emission efficiency. Therefore, the above-described configuration is preferable. In the case in which an additional layer is provided between the well layer 33 and the second barrier layer 34, it is preferable that the additional layer has such a small thickness that the layer does not serve as the intermediate layer 32. Specifically, the distance between the well layer 33 and the second barrier layer 34 is preferably smaller than the thickness of the well layer 33. When the additional layer is provided between the well layer 33 and the second barrier layer 34, the additional layer has a lattice constant and band-gap energy between those of the well layer 33 and those of the second barrier layer 34.

Preferably, the layers forming the active region 3 each include a binary or ternary compound semiconductor such as GaN or InGaN. In the case of using a quaternary compound semiconductor such as AlInGaN, a layered structure with a large band-gap energy difference and a small lattice constant difference can be formed by adjusting the composition ratio of the compound semiconductor. However, a composition ratio close to a design value is more easily obtained with a binary or ternary compound semiconductor than with a quaternary compound semiconductor. Thus, it is preferable that the active region 3 includes a binary or ternary compound semiconductor. In this case, the lattice constant difference between the layers tends to become large, and therefore it is more preferable to provide the intermediate layer 32 enabling strain to be mitigated.

Figure 4:
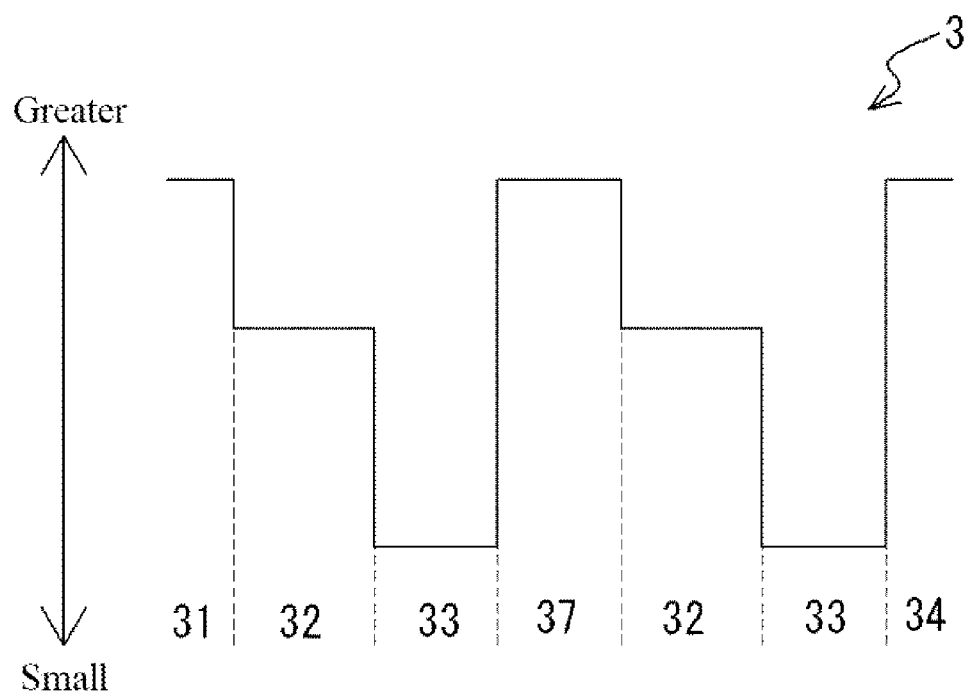
FIG. 4 schematically illustrates a first modification of the active region.

In the case in which the active region 3 has a multiple quantum well structure, a plurality of well layers 33 is disposed, and an intermediate barrier layer 37 is disposed between the well layers 33 as shown in FIG. 4. In this case, the active region 3 may be configured such that the relationship of all the well layers 33 with the layers sandwiching the well layers 33 is equivalent to the relationship of the first barrier layer 31, the intermediate layer 32, the well layer 33 and the second barrier layer 34 as shown in FIG. 2. The intermediate layer 32 may be a compositionally graded layer, or may be not a compositionally graded layer. The active region 3 shown in FIG. 2 has a single quantum well structure. In the case in which the active region 3 has a single quantum well structure, an optical loss can be decreased because light emitted at the well layer 33 is not absorbed in another well layer, and the crystallinity of a layer (e.g. layer of the p-side region 4) to be grown immediately after the active region 3 can be improved because the number of barrier layers 31 is small. On the other hand, in the single quantum well structure, an optical confinement coefficient may be lower than in the multiple quantum well structure, resulting in an increase in threshold current, but the threshold current can be reduced by providing the intermediate layer 32. In addition, in the case of the multiple quantum well structure, a plurality of intermediate layers 32 is provided, and therefore in the case in which the thickness of each intermediate layer 32 is increased, the crystallinity of the well layer 33 may be deteriorated. Thus, with the single quantum well structure, the intermediate layer 32 may be easier to obtain the effect of lowering the threshold current by increasing the thickness of the intermediate layer 32.

First Barrier Layer 31

For the first barrier layer 31, a material having band-gap energy greater than that of the well layer 33, such as InGaN, GaN or AlGaN, can be used. In the case in which the composition ratio of indium (In) in the well layer 33 is relatively high as in the case in which the emission wavelength is 430 nm or more, $In_aGa_{1-a}N$ ($0 \le a < 1$) is preferable for preventing an excessively large lattice constant difference between the first barrier layer 31 and the well later 33. Preferably, the first barrier layer 31 is composed of GaN for improving the crystallinity of the well layer 33. The thickness of the first barrier layer 31 may be set to the thickness of one atomic layer or more and 20 nm or less.

Intermediate Layer 32

Figure 7:
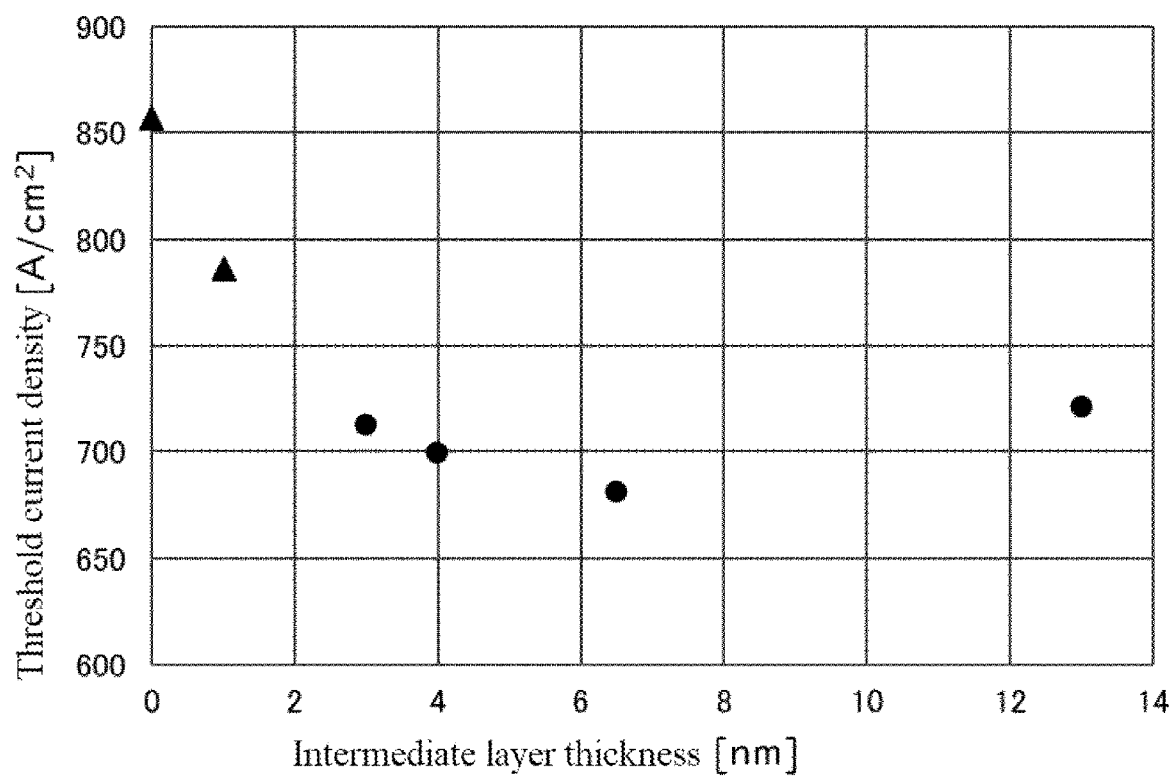
FIG. 7 is a graph illustrating threshold current densities of semiconductor laser elements of Examples 1 to 4 and Comparative Examples 1 and 2.

The effect of mitigating strain on the well layer 33 may be enhanced as the thickness of the intermediate layer 32 becomes larger. Thus, the thickness of the intermediate layer 32 is preferably not less than 1.5 times the thickness of the well layer 33. As shown in FIG. 7 described later, there is a tendency that the degree of change in threshold current density by an increase in thickness is high in the case in which the thickness of the intermediate layer 32 is less than the thickness of the well layer 33, and the degree of change in threshold current density is moderate in the case in which the thickness of the intermediate layer 32 is greater than the thickness of the well layer 33. It is considered preferable to employ a thickness in a range corresponding to the moderate degree of change in threshold current density in order to stabilize the quality of the resulting semiconductor laser element 100. Thus, from this point of view, the thickness of the intermediate layer 32 is preferably not less than 1.5 times the thickness of the well layer 33. From FIG. 7, it can be considered that the thickness of the intermediate layer 32 is preferably 3 nm or more. On the other hand, the probability of overflow of carriers (e.g. holes) may increase as the thickness becomes larger. Thus, the thickness of the intermediate layer 32 is preferably less than 6 times, more preferably not more than 3 times the thickness of the well layer 33. Referring to FIG. 7, the thickness of the intermediate layer 32 is preferably less than 13 nm, more preferably 6 nm or less.

For the intermediate layer 32, a material having a lattice constant between those of the first barrier layer 31 and the well layer 33 can be used. Examples of the material include $In_bGa_{1-b}N$ (a<b<1) that has a higher composition ratio of indium (In) as compared to that of the first barrier layer 31 and a lower composition ratio of indium (In) as compared to that of the well layer 33. In the case in which the first barrier layer 31 is composed of GaN, the composition ratio of In in this layer is 0%. In the case in which the intermediate layer 32 is composed of $In_bGa_{1-b}N$, it is considered that as the composition ratio b of In becomes close to the composition ratio of In in the well layer 33, the effect of mitigating strain on the well layer 33 is enhanced, but the probability of overflow of carriers becomes higher. Thus, the composition ratio "b" of In in the intermediate layer 32 is preferably not more than half the total value of the composition ratio c of In in the well layer 33 and the composition ratio "a" of In in the first barrier layer 31. The composition ratio "b" of In in the intermediate layer 32 may be not more than half the composition ratio "c" of In in the well layer 33. The composition ratio "b" of In in the intermediate layer 32 may be, for example, 5 to 15%. In FIG. 2, the intermediate layer 32 is in contact with the first barrier layer 31.

Preferably, the intermediate layer 32 is disposed between the well layer 33 and the n-side region 2. This is because it is more difficult for holes to move than for electrons in a nitride semiconductor. By disposing the intermediate layer 32 on the well layer 33 at the n-side region 2 side, strain on the well layer 33 can be mitigated, and the carrier recombination probability can efficiently be increased. In addition, in the case in which a nitride semiconductor is used for each semiconductor layer, the n-side region 2, the active region 3 and the p-side region 4 tend to be grown in this order, it is considered that growth of the intermediate layer 32 before growth of the well layer 33 is advantageous for mitigation of strain on the well layer 33.

The intermediate layer 32 may be undoped, or may contain an impurity of first conductivity-type (e.g. n-type impurity). The intermediate layer 32 containing an impurity of first conductivity-type can reduce the probability of overflow of carriers (e.g. holes). In the case in which the intermediate layer 32 contains an impurity rather than being undoped, the greater the thickness, the more easily the crystallinity is deteriorated. Therefore, in the case in which the intermediate layer 32 contains an impurity, particularly, the intermediate layer 32 preferably has the thickness less than 13 nm as described above. As the n-type impurity and the p-type impurity, the same materials as described with regard to the n-side region 2 and the p-side region 4 can be used. For example, in the case in which the intermediate layer 32 contains an n-type impurity, the concentration of electron carriers is preferably at least $1\times10^{18}$ $cm^3$, more preferably at least $1\times10^{19}$ $cm^3$, and preferably $1\times10^{20}$ $cm^3$ or less, more preferably $6\times10^{19}$ $cm^3$ or less. Setting the concentration of electron carriers in such a range can more efficiently reduce the probability of overflow of holes.

Figure 5:
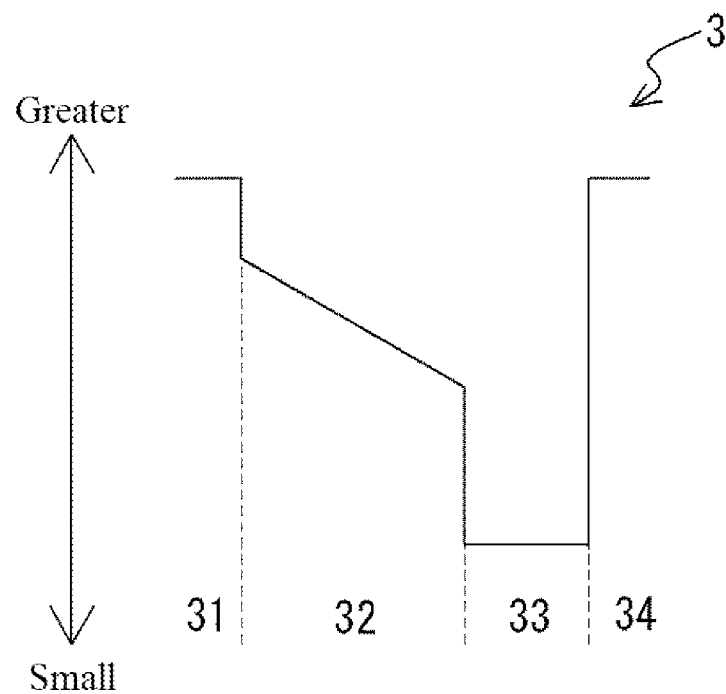
FIG. 5 schematically illustrates a second modification of the active region.

The intermediate layer 32 may be a compositionally graded layer as shown in FIG. 5. It is considered that in the case in which the intermediate layer 32 is a compositionally graded layer in which the lattice constant (i.e., the composition ratio "b" of In in the case of $In_bGa_{1-b}N$) increases as going from the first barrier layer 31 toward the well layer 33, the effect of mitigating strain on the well layer 33 is further enhanced. The composition ratio "b" of In in a portion of the intermediate layer 32, which is closest to the first barrier layer 31, is higher than the composition ratio "a" of In (0%) in the first barrier layer 31 in FIG. 4, but may be equal to the composition ratio "a" of In in the first barrier layer 31.

In this specification, the compositionally graded layer is a layer in which a plurality of layers is stacked as a multilayer structure and the composition is graded as a whole. For example, in a compositionally graded layer is an $In_XGa_{1-X}N$ (0≤X<1) layer, the thickness of each layer forming the compositionally graded layer is 25 nm or less, and a difference in composition ratio of In between adjacent layers is 0.5% or less. Further, the thickness of each layer is preferably 20 nm or less. The lower limit of the thickness of each layer is, for example, the thickness of one atomic layer. The difference in composition ratio of In between adjacent layers is preferably 0.1% or less. The upper limit of the difference is, for example, about 0.007%. Setting the thickness and the composition difference in the range described above can reduce strain generated in the compositionally graded layer. In the case in which the compositionally graded layer is compared to other layers for the composition ratio of In, the lattice constant and the like of the compositionally graded layer, an average value in the compositionally graded layer is used. For example, in the case of a compositionally graded layer in which the composition ratio of In is gradually changed from 7% to 10%, the average value thereof (i.e., 8.5%) is defined as a composition ratio of In in the compositionally graded layer, and compared to the composition ratios of In in other layers.

The intermediate layer 32 is adjacent to the well layer 33, thus the intermediate layer 32 may also serve as a core layer of a core/clad structure. Thus, the optical confinement coefficient can be expected to be improved by providing the intermediate layer 32. Improvement of the optical confinement coefficient can lead to improvement of light emission efficiency, thereby reducing the threshold current.

Well Layer 33

The well layer 33 may be composed of $In_cGa_{1-c}N$ (b<c<1). The composition ratio "c" of In in the well layer 33 may be, for example, 17% or more. As the emission wavelength of the semiconductor laser element 100 becomes longer, the composition ratio "c" of In in the well layer 33 increases, thereby increasing lattice constant difference between the well layer 33 and a layer outside the active region 3. Consequently, the semiconductor laser element is likely to be more significantly affected by a piezoelectric field. Therefore, it is preferable to provide the intermediate layer 32 particularly in the case in which the emission wavelength of the semiconductor laser element 100 is 430 nm or more. In the case in which the emission wavelength of the semiconductor laser element is 430 nm or more, the composition ratio "c" of In in the well layer 33 increases or decreases to some extent depending on an overall layer structure, but is, for example, 10% or more. The composition ratio "c" of In in the well layer 33 may be, for example, 50% or less. Here, the emission wavelength of the semiconductor laser element is considered to be about 600 nm or less. The thickness of the well layer 33 may be, for example, in a range of 2 nm to 4 nm. Preferably, the well layer 33 is undoped from the viewpoint of improvement of crystallinity and reduction of light absorption.

Second Barrier Layer 34

The second barrier layer 34 has band-gap energy greater than that of the well layer 33. The second barrier layer 34 is composed of, for example, $In_dGa_{1-d}N$ (0≤d<b). The composition and the thickness of the second barrier layer 34 can be set within the same range as those of the first barrier layer 31. In the case in which the second barrier layer 34 contains an n-type impurity, there is a possibility of light absorption and trapping of holes, and Mg as a p-type impurity causes light absorption. Therefore it is preferable that the second barrier layer 34 is undoped. For example, the second barrier layer 34 is an undoped GaN layer.

Other Layers

Figure 6:
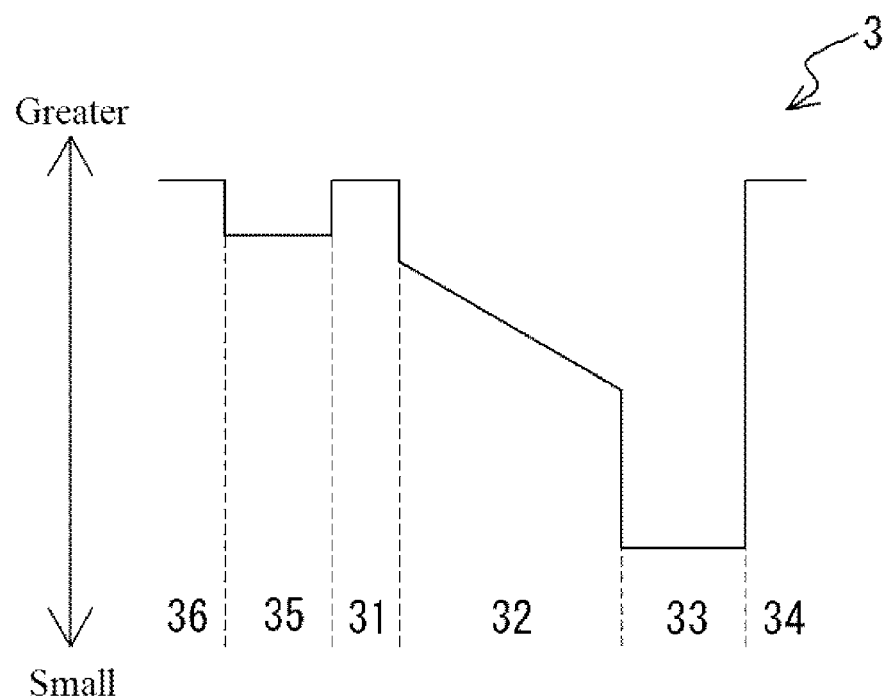
FIG. 6 schematically illustrates a third modification of the active region.

In FIG. 2, the first barrier layer 31 is disposed at the outermost side of the active region 3, in other words, positioned closest to the n-side region 2, but a different layer may be disposed at the n-side region 2 side of the first barrier layer 31. For example, as shown in FIG. 6, an InGaN layer 35 having a larger lattice constant and a greater thickness as compared to the first barrier layer 31 may be disposed at the n-side region 2 side of first barrier layer 31 with the thickness of the first barrier layer 31 set to 5 nm or less. By providing such an InGaN layer 35, strain on the well layer 33 can be mitigated. The thickness of the InGaN layer 35 may be 30 nm or less. When the InGaN layer 35 is provided, a GaN layer 36 may be further provided on the InGaN layer on the substrate 1 side. The thickness of the GaN layer 36 may be 5 nm or less. As described later, it is preferable to dispose the intermediate layer 32 between the well layer 33 and the n-side region 2, and therefore it is preferable to dispose the first barrier layer 31 between the well layer 33 and the n-side region 2. It is preferable that the first barrier layer 31 is disposed in the vicinity of the well layer 33 for the first barrier layer 31 to serve as a barrier layer having a quantum well structure. For example, it is preferable that the first barrier layer 31 is positioned at a distance of 20 nm or less from the well layer 33.

The well layer 33 and the intermediate layer 32 are in contact with each other in FIG. 2, but a thin-film layer (i.e., first thin-film layer) may be provided between the well layer 33 and the intermediate layer 32. To obtain the effect of the intermediate layer 32, it is preferable to dispose the intermediate layer 32 near the well layer 33, and therefore, the first thin-film layer is provided with such a thickness that the effect of the intermediate layer 32 is not hindered. For example, the thickness of the first thin-film layer may be equal to or less than the thickness of the well layer 33, and may be 2 nm or less. In other words, the distance between the well layer 33 and the intermediate layer 32 may be equal to or less than the thickness of the well layer 33, and may be 2 nm or less. The first thin-film may be a compositionally graded layer having a composition in which the lattice constant increases as approaching from the intermediate layer 32 toward the well layer 33. In this way, strain applied to the well layer 33 can be mitigated. The first thin-film layer is not required to be a compositionally graded layer. In this case, the first thin-film layer may be provided as a layer having a lattice constant and band-gap energy between those of the intermediate layer 32 and the well layer 33.

The second barrier layer 34 is in contact with the well layer 33 in FIG. 2, but a thin-film layer (i.e., second thin-film layer) may be provided between the second barrier layer 34 and the well layer 33. The second thin-film layer may be a layer having a lattice constant and band-gap energy between those of the second barrier layer 34 and the well layer 33. Preferably, the second thin-film layer has such a thickness that the second thin-film layer does not serve as the intermediate layer 32. The thickness of the second thin-film layer may be smaller than the thickness of the well layer 33. The thickness of the second thin-film layer may be, for example, 2 nm or less.

P-Side Region 4

The p-side region 4 may be a nitride semiconductor layer having a single-layer or multilayer structure. Examples of the p-type nitride semiconductor layer contained in the p-side region 4 may be nitride semiconductor layers containing a p-type impurity such as Mg. The p-side region 4 has, for example, a p-side compositionally graded layer 41, a first p-type semiconductor layer 42, the second p-type semiconductor layer 43 (i.e., p-type nitride semiconductor layer) and a third p-type semiconductor layer 44, in this order from the active region 3 side. In the p-side region 4, layers other than these layers may be disposed, and some of these layers may be omitted. The semiconductor laser element 100 is provided with the ridge 4a. In the active region 3, a portion immediately under the ridge 4a and the vicinity thereof is a waveguide region. The ridge 4a is not required to be formed.

The p-side compositionally graded layer 41 is a layer in which a composition is gradually changed, for example, from InGaN at the active region 3 side to GaN at the first p-type semiconductor layer 42 side. The p-side compositionally graded layer 41 is preferably undoped for the same reason as in the case of the second barrier layer 34. The thickness of the p-side compositionally graded layer 41 may be 50 nm to 500 nm. The p-side compositionally graded layer 41 is preferably free from about 0.004 eV/nm or more of a band-offset over the entire p-side compositionally graded layer 41 except for an interface on the active region 3 side and an interface on the first p-type semiconductor layer 42 side. When a sharp band-offset is present, holes may be trapped, but as long as the band-offset is less than 0.004 eV/nm, it is possible to reduce the probability that holes are trapped. When the p-side compositionally graded layer 41 is composed of GaN or InGaN, it is preferable that a sharp composition ratio variation of 0.1%/nm or more in terms of a ratio of In to InGaN does not occur. When the barrier layer in the active region 3 has a small thickness, the p-side compositionally graded layer 41 may serve as a barrier function.

Each of the first to third p-type semiconductor layers 42 to 44 contains a p-type impurity. The first p-type semiconductor layer 42 is, for example, an AlGaN layer. The first p-type semiconductor layer 42 serves as, for example, an electron blocking layer. The first p-type semiconductor layer 42 may be provided as a layer having the highest band-gap energy in the p-side region 4 and having a thickness smaller than that of the p-side compositionally graded layer 41. The second p-type semiconductor layer 43 (in this embodiment, this layer is a p-type nitride semiconductor layer) is, for example, an AlGaN layer. The second p-type semiconductor layer 43 may have the second highest band-gap energy following the electron blocking layer in the p-side region 4. An undoped semiconductor layer may be disposed between the first p-type semiconductor layer 42 and the second p-type semiconductor layer 43. With regard to the magnitude relationship between the thickness of the undoped layer and the second p-type semiconductor layer 43, the second p-type semiconductor layer 43 may have a greater thickness than, or have substantially the same thickness as the undoped layer, in order to reduce light absorption in the p-side region 4. The undoped layer and the second p-type semiconductor layer 43 are, for example, layers which are identical in composition to each other. The third p-type semiconductor layer 44 is, for example, a GaN layer, and serves as a p-type contact layer. A layer serving as a p-side waveguide layer (i.e., second waveguide layer) is, for example, the p-side compositionally graded layer 41 and/or the p-type semiconductor layer 43. The second p-type semiconductor layer 43 may be a layer serving as a p-side cladding layer (i.e., second cladding layer), but when a material having the function of a cladding layer such as ITO is used for the later-described p-electrode 6, the p-electrode 6 is used as a cladding layer, and it is not necessary to provide a cladding layer in the p-side region 4.

Other Members

The semiconductor laser element 100 may include the insulating film 5 provided on a part of the surface of the p-side region 4. The insulating film 5 may be formed using, for example, a single-layer film or a multilayered film of an oxide or a nitride of Si, Al, Zr, Ti, Nb, Ta or the like. The thickness of the insulating film 5 may be in a range of about 10 to 500 nm. The p-electrode 6 is provided on, for example, the upper surface of the ridge 4a. The p-side pad electrode 7 is provided in contact with the p-electrode 6. The p-side pad electrode 7 has an area larger than that of the p-electrode 6, and a wire or the like is connected to the p-side pad electrode 7. The n-electrode 8 is provided, for example, over substantially the entire lower surface of the n-type substrate 1. Each electrode may be a single layer or multilayer formed using metals such as Ni, Rh, Cr, Au, W, Pt, Ti and Al, or alloys thereof, and a conductive oxide or the like containing at least one selected from a metal thereof, Zn, In and Sn. Examples of the conductive oxide include ITO (indium tin oxide), IZO (indium zinc oxide) and GZO (gallium-doped zinc oxide). The thickness of each electrode is, for example, in a range of about 0.1 μm to 2 μm. In this specification, a side at which the p-side region 4 is positioned is defined as an upper side, and a side at which the n-side region 2 is positioned is defined as a lower side, with respect to the active region 3. "The upper surface" and "the lower surface" in this specification is referred in accordance with such upper and lower direction.

Figure 3:
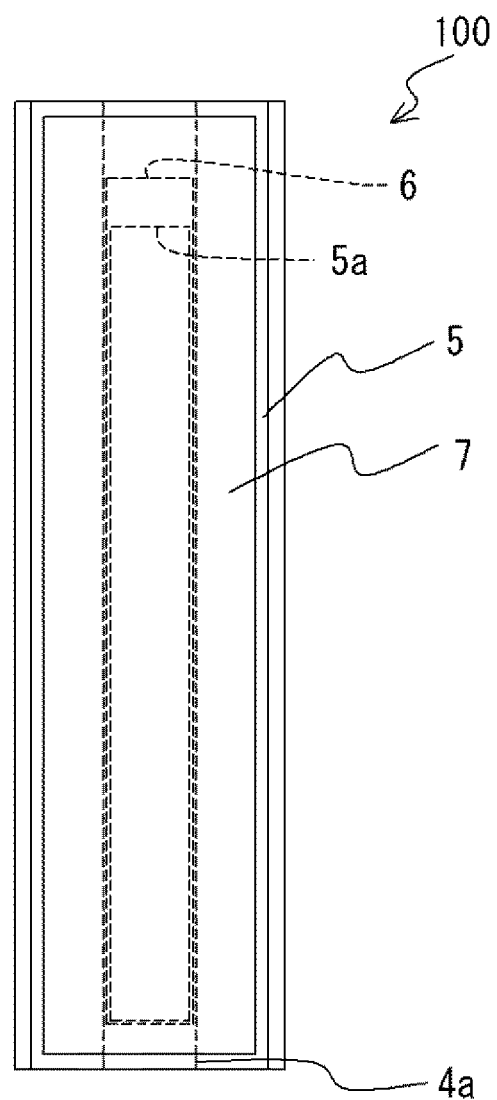
FIG. 3 is a schematic top view illustrating the semiconductor laser element according to certain embodiment of the present disclosure.

FIG. 3 is a schematic top view of the semiconductor laser element 100. It is preferable that the p-electrode 6 is provided away from a light emission end surface and a light reflection end surface as shown in FIG. 3. In this way, concentration of currents at each end surface and in the vicinity thereof can be mitigated. In addition, it is preferable to provide the electrodes in such a manner that in top view, the distance between the p-side pad electrode 7 and each of the light emission end surface and the light reflection end surface is shorter than the distance between the p-electrode 6 and each of these end surfaces. In this way, heat generated at the light emission end surface and the light reflection end surface and in the vicinity thereof can be dissipated by the p-side pad electrode 7. Such configurations can reduce the probability of catastrophic failure of the semiconductor laser element 100. The light emission end surface tends to generate heat more than the light reflection end surface does, it is preferable that the distance between the p-electrode 6 and the light emission end surface is greater than the distance between the p-electrode 6 and the light reflection end surface.

In addition, the insulating film 5 may cover a part of the p-side electrode 6 as shown in FIGS. 1 and 3. The insulating film 5 is provided with an opening 5a, and the p-electrode 6 is connected to the p-side electrode 7 through the opening 5a. With such a configuration, a current injected from the p-side pad electrode 7 is blocked off by the insulating film 5. Thus, adjusting the region covered with the insulating film 5 can adjust a region in which current is injected. The covered region at the light emission end surface side may be larger in size than the covered region at the light reflection end surface side as shown in FIG. 3. With this configuration, the current injection amount at the light emission end surface side can be reduced, and heat generation at the light reflection end surface side can be reduced. In addition, the end of the p-electrode 6 is positioned closer to the light reflection end surface than the end of the light injection region, thus dissipation of heat by the p-electrode 6 can be expected. A reflection film such as a dielectric multilayer film may be formed on the light emission end surface and/or the light reflection end surface. The width of the p-electrode 6 may be equal to the width of the upper surface of the ridge 4a.

EXAMPLE 1

As Example 1, a semiconductor laser element was provided as described below.

An n-side region 2 was grown on a GaN substrate (i.e., substrate 1) having +c-plane as a principal surface. The n-side region 2 has the following layers in this order from the GaN substrate side:

a 1.5 μm-thick Si-doped $Al_{0.02}Ga_{0.98}N$ layer (i.e., first n-type semiconductor layer 21);

a 150 nm-thick Si-doped $In_{0.05}Ga_{0.95}N$ layer (i.e., second n-type semiconductor layer 22);

a 1 μm-thick Si-doped $Al_{0.07}Ga_{0.93}N$ layer (i.e., third n-type semiconductor layer 23);

a 300 nm-thick Si-doped GaN layer (i.e., fourth n-type semiconductor layer 24); and a 250 nm-thick Si-doped compositionally graded layer (n-side compositionally graded layer 25).

The n-side compositionally graded layer 25 was grown by substantially monotonically increasing the composition ratio of In so as to obtain a substantially linear composition gradient with GaN as a growth starting end and $In_{0.05}Ga_{0.95}N$ as a growth terminating end.

Subsequently, the active region 3 was grown. The active region 3 has the following layers in this order from the n-side region 2 side:

a 1 nm-thick Si-doped GaN layer;

a 8 nm-thick Si-doped InGaN layer;

a 1 nm-thick Si-doped GaN layer (i.e., first barrier layer 31);

a 3 nm-thick undoped InGaN compositionally graded layer (i.e., intermediate layer 32);

a 2.25 nm-thick undoped $In_{0.2}Ga_{0.8}N$ layer (i.e., well layer 33); and a 1 nm-thick undoped GaN layer (i.e., second barrier layer 34).

The intermediate layer 32 was grown by substantially monotonically increasing the composition ratio of In so as to obtain a substantially linear composition gradient with $In_{0.07}Ga_{0.93}N$ as a growth starting end and $In_{0.1}Ga_{0.9}N$ as a growth terminating end.

Subsequently, the p-side region 4 was grown. The p-side region 4 has the following layers in this order from the active region 3 side:

a 250 nm-thick undoped compositionally graded layer (i.e., p-side compositionally graded layer 41);

a 10 nm-thick AlGaN layer doped with Mg and having a high composition ratio of Al (i.e., first p-type semiconductor layer 42);

a 300 nm-thick AlGaN layer partially doped with Mg and having a low composition ratio of Al (i.e., second p-type semiconductor layer 43); and a 15 nm-thick GaN layer finally doped with Mg (i.e., third p-type semiconductor layer 44).

The p-side compositionally graded layer 41 was grown by substantially monotonically decreasing the composition ratio of In so as to obtain a substantially linear composition gradient with $In_{0.05}Ga_{0.95}N$ as a growth starting end and GaN as a growth terminating end.

The epitaxial wafer provided with the above-mentioned layers was taken out from a MOCVD reactor, a ridge, an n-electrode, a p-electrode and the like were formed, and the wafer was divided to obtain a semiconductor laser element. The semiconductor laser element had a ridge width of 45 μm and a resonator length of 1200 μm.

EXAMPLES 2 TO 4

In Examples 2 to 4, semiconductor laser elements were provided in the same manner as in Example 1 except that the thickness of the intermediate layer 32 was changed. The thickness of the intermediate layer 32 was 4 nm in Example 2, the thickness of the intermediate layer 32 was 6.5 nm in Example 3, and the thickness of the intermediate layer 32 was 13 nm in Example 4. The intermediate layer 32 in each of Examples 2 to 4 was a compositionally graded layer like the intermediate layer 32 in Example 1, and had the same compositions at a growth starting end and at a growth terminating end as in Example 1.

COMPARATIVE EXAMPLE 1

In Comparative Example 1, a semiconductor laser element was provided in the same manner as in Example 1 except that the intermediate layer 32 was not provided.

COMPARATIVE EXAMPLE 2

In Comparative Example 2, a semiconductor laser element was provided in the same manner as in Example 1 except that the thickness of the intermediate layer 32 was changed. In Comparative Example 2, the thickness of the intermediate layer 32 was 1 nm.
Threshold Current Density and Relative Light Output In each of Examples 1 to 4 and Comparative Examples 1 and 2, a plurality of semiconductor laser elements was provided under the same conditions. The threshold current density and the relative light output of each semiconductor laser element were measured, and the median values thereof in each of examples and comparative examples were respectively determined as values of threshold current density and relative light output in each of examples and comparative examples. In each of the examples and comparative examples, the median value of the emission wavelength of the semiconductor laser element was about 455 nm. In addition, the relative light output is a value obtained by dividing a light output measured at an environmental temperature of 80° C. by a light output measured at an environmental temperature of 25° C. The larger the value of relative light output, the better the light output temperature characteristic.

FIG. 7 shows the threshold current densities of the semiconductor laser elements in Examples 1 to 4 and Comparative Examples 1 and 2. The smaller the threshold current density, the lower the threshold current. The results shown in FIG. 7 reveal that the threshold current density is reduced by providing an intermediate layer. As shown in FIG. 7, the threshold current density rapidly decreases until the thickness of the intermediate layer becomes substantially the same as the thickness of the well layer, and the threshold current density gradually decreases at a greater thickness. This result indicates that setting the thickness of the intermediate layer greater than the thickness of the well layer can stably provide a semiconductor laser element with a low threshold current. On the other hand, increasing the thickness of the intermediate layer to 13 nm raises the threshold current density a slightly high value. This may be because the probability of overflow of holes increased as the intermediate layer was thickened.

The relative light output was 70% in Comparative Example 1 (thickness of 0 nm), 72% in Comparative Example 2 (thickness of 1 nm), 74% in Example 1 (thickness of 3 nm), 74% in Example 2 (thickness of 4 nm), 72% in Example 3 (thickness of 6.5 nm), and 69% in Example 4 (thickness of 13 nm). Each of these values is a relative light output value rounded off to the nearest integer. As described above, the relative light output was generally increased by providing an intermediate layer, but the value of relative light output was lower when the thickness of the intermediate layer was 13 nm than when the intermediate layer was not provided. This may be because as the threshold current density becomes lower, the amount of holes fixed by laser emission decreases, leading to an increase in relative light output, but as the thickness of the intermediate layer increases, it becomes easier for holes to seep out to the n-side region side, leading to a decrease in relative light output. These results indicate that it is preferable that the thickness of the intermediate layer is not excessively large.

The semiconductor laser element according to the present disclosure can be used for light sources for displays such as light sources for projectors and televisions, light sources for medical use, and light sources for lighting, as well as light sources for optical discs.

What is claimed is:

1. A semiconductor laser element comprising:
    a first nitride semiconductor layer of a first conductivity-type;
    a second nitride semiconductor layer of a second conductivity-type; and an active region disposed between the first nitride semiconductor layer and the second nitride semiconductor layer, the active region having a single quantum well structure, wherein:
    the active region comprises a first barrier layer, an intermediate layer, a well layer, and a second barrier layer, in this order in a direction from the first nitride semiconductor layer toward the second nitride semiconductor layer,
    the well layer is composed of InGaN,
    the second barrier layer is undoped,
    a lattice constant of the intermediate layer is greater than a lattice constant of each of the first barrier layer and the second barrier layer, and smaller than a lattice constant of the well layer, and
    a thickness of the intermediate layer is greater than a thickness of the well layer.

2. The semiconductor laser element according to claim 1, wherein the thickness of the intermediate layer is less than 13 nm.

3. The semiconductor laser element according to claim 1, wherein the thickness of the intermediate layer is 3 nm or more.

4. The semiconductor laser element according to claim 1, wherein:
    the first barrier layer is an $In_aGa_{1-a}N$ (0≤a<1) layer,
    the intermediate layer is an $In_bGa_{1-b}N$ (a<b<1) layer,
    the well layer is an $In_cGa_{1-c}N$ (b<c<1) layer, and
    the second barrier layer is an $In_dGa_{1-d}N$ (0≤d<b) layer.

5. The semiconductor laser element according to claim 4, wherein a composition ratio b of In in the intermediate layer is not more than half the composition ratio c of In in the well layer.

6. The semiconductor laser element according to claim 1, wherein the intermediate layer is a compositionally graded layer having a composition in which the lattice constant increases in a direction from the first barrier layer toward the well layer.

7. The semiconductor laser element according to claim 1, wherein:
the semiconductor laser element comprises a first cladding layer, a second cladding layer, a first waveguide layer, and a second waveguide layer,
the active region is disposed between the first cladding layer and the second cladding layer,
the first waveguide layer is disposed between the first cladding layer and the active region, and
the second waveguide layer is disposed between the second cladding layer and the active region.

8. The semiconductor laser element according to claim 7, wherein:
the first nitride semiconductor layer is the first cladding layer or the first waveguide layer, and
the second nitride semiconductor layer is the second cladding layer or the second waveguide layer.

9. The semiconductor laser element according to claim 1, wherein:
the first nitride semiconductor layer is an n-type nitride semiconductor layer, and the second nitride semiconductor layer is a p-type nitride semiconductor layer.

10. The semiconductor laser element according to claim 1, further comprising:
a substrate,
wherein the first nitride semiconductor layer, the active region and the second nitride semiconductor layer are disposed in this order in a direction from the substrate.

11. The semiconductor laser element according to claim 1, wherein:
the thickness of the intermediate layer is not less than 1.5 times the thickness of the well layer.

12. The semiconductor laser element according to claim 1, wherein:
the thickness of the intermediate layer is not more than 6 times the thickness of the well layer.

13. The semiconductor laser element according to claim 1, wherein:
the well layer and the second barrier layer are in contact with each other, or a distance between the well layer and the second barrier layer is smaller than a distance between the first barrier layer and the well layer.

* * * * *